(12) United States Patent
Nam et al.

(10) Patent No.: US 10,644,171 B2
(45) Date of Patent: *May 5, 2020

(54) SOLAR CELL

(71) Applicant: LG ELECTRONICS INC., Seoul (KR)

(72) Inventors: Jeongbeom Nam, Seoul (KR); Doohwan Yang, Seoul (KR); Eunjoo Lee, Seoul (KR); Ilhyoung Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 3 days.

This patent is subject to a terminal disclaimer.

(21) Appl. No.: 15/727,341

(22) Filed: Oct. 6, 2017

(65) Prior Publication Data

US 2018/0033899 A1 Feb. 1, 2018

Related U.S. Application Data

(63) Continuation of application No. 14/536,270, filed on Nov. 7, 2014, now Pat. No. 9,799,781.

(30) Foreign Application Priority Data

Nov. 8, 2013 (KR) .................... 10-2013-0135649

(51) Int. Cl.
*H01L 31/0224* (2006.01)
*H01L 31/05* (2014.01)
(Continued)

(52) U.S. Cl.
CPC ......... *H01L 31/022425* (2013.01); *H01L 31/022441* (2013.01); *H01L 31/022491* (2013.01);
(Continued)

(58) Field of Classification Search
None
See application file for complete search history.

(56) References Cited

U.S. PATENT DOCUMENTS

| 5,017,553 A | 5/1991 | Whitlow et al. |
| 6,399,873 B1 | 6/2002 | Sano et al. |

(Continued)

FOREIGN PATENT DOCUMENTS

| CN | 1965414 A | 5/2007 |
| CN | 101246928 A | 8/2008 |

(Continued)

OTHER PUBLICATIONS

Chae et al., "Measurement of Thermal Expansion Coefficient of Poly-Si Using Microgauge Sensors," SPIE (1997) vol. 3242, pp. 202-211.

*Primary Examiner* — Eli S Mekhlin
(74) *Attorney, Agent, or Firm* — Birch, Stewart, Kolasch & Birch, LLP

(57) ABSTRACT

A solar cell can include a photoelectric conversion unit including a semiconductor substrate, a tunneling layer disposed on the semiconductor substrate, a first conductive type region and a second conductive type region disposed on the tunneling layer at a same side of the semiconductor substrate, and a barrier region disposed between the first and second conductive type regions; and an electrode disposed on the photoelectric conversion unit and including an adhesive layer disposed on the first and second conductive type regions, and an electrode layer disposed on the adhesive layer, in which the adhesive layer has a coefficient of thermal expansion that is greater than a coefficient of thermal expansion of the photoelectric conversion unit and is less than a coefficient of thermal expansion of the electrode layer.

19 Claims, 8 Drawing Sheets

(51) Int. Cl.
*H01L 31/068* (2012.01)
*H01L 31/056* (2014.01)

(52) U.S. Cl.
CPC ........ *H01L 31/056* (2014.12); *H01L 31/0516* (2013.01); *H01L 31/0682* (2013.01); *Y02E 10/52* (2013.01); *Y02E 10/547* (2013.01)

(56) References Cited

U.S. PATENT DOCUMENTS

| | | |
|---|---|---|
| 2002/0011264 A1 | 1/2002 | Saito |
| 2004/0140564 A1* | 7/2004 | Lee ............... H01L 21/76801 257/758 |
| 2007/0169808 A1 | 7/2007 | Kherani et al. |
| 2007/0194357 A1 | 8/2007 | Oohashi et al. |
| 2007/0256728 A1 | 11/2007 | Cousins |
| 2008/0006323 A1 | 1/2008 | Kalkanoglu et al. |
| 2008/0216887 A1 | 9/2008 | Hacke et al. |
| 2008/0283117 A1 | 11/2008 | Tsunomura |
| 2009/0162972 A1 | 6/2009 | Xu et al. |
| 2009/0239331 A1 | 9/2009 | Xu et al. |
| 2009/0255581 A1 | 10/2009 | Myong |
| 2010/0018748 A1 | 1/2010 | Aoyama et al. |
| 2010/0186813 A1* | 7/2010 | Knoll ............... H01L 31/046 136/256 |
| 2010/0224249 A1 | 9/2010 | Fukunaga et al. |
| 2010/0275989 A1 | 11/2010 | Fujii et al. |
| 2011/0048501 A1 | 3/2011 | Jaus et al. |
| 2011/0139243 A1 | 6/2011 | Shim et al. |
| 2011/0174362 A1 | 7/2011 | Tanner et al. |
| 2012/0012176 A1 | 1/2012 | Kim et al. |
| 2012/0060912 A1 | 3/2012 | Cho et al. |
| 2012/0145233 A1 | 6/2012 | Syn et al. |
| 2012/0152598 A1 | 6/2012 | Yamada et al. |
| 2012/0168717 A1 | 7/2012 | Aihara et al. |
| 2012/0247560 A1 | 10/2012 | Rim et al. |
| 2012/0325309 A1 | 12/2012 | Takahama et al. |
| 2013/0133729 A1 | 5/2013 | Mo et al. |
| 2013/0223031 A1 | 8/2013 | Schmideder et al. |
| 2013/0267046 A1 | 10/2013 | Or-Bach et al. |
| 2013/0269771 A1 | 10/2013 | Cheun et al. |
| 2014/0373896 A1 | 12/2014 | Matsuura et al. |

FOREIGN PATENT DOCUMENTS

| | | |
|---|---|---|
| CN | 101465391 A | 6/2009 |
| CN | 101546792 A | 9/2009 |
| CN | 101877366 A | 11/2010 |
| CN | 102263157 A | 11/2011 |
| CN | 102610686 A | 7/2012 |
| CN | 202487592 U | 10/2012 |
| CN | 203103314 U | 7/2013 |
| EP | 2590233 A2 | 5/2013 |
| JP | 2006-324590 A | 11/2006 |
| JP | 2011-155229 A | 8/2011 |
| JP | 2012-49193 A | 3/2012 |
| KR | 10-2011-0018651 A | 2/2011 |
| KR | 10-2012-0009562 A | 2/2012 |
| KR | 10-2012-0026813 A | 3/2012 |
| KR | 10-2013-0058497 A | 6/2013 |
| WO | WO 2011/093361 A1 | 8/2011 |
| WO | WO 2013/090545 A2 | 6/2013 |
| WO | WO 2013/145008 A1 | 10/2013 |

* cited by examiner (a)

(b)

(c)

(a)

(b)

(a)

(b)

SOLAR CELL

CROSS-REFERENCE TO RELATED APPLICATION

This application is a Continuation of U.S. application Ser. No. 14/536,270 filed on Nov. 7, 2014 (now U.S. Pat. No. 9,799,781), which claims the priority benefit of Korean Patent Application No. 10-2013-0135649, filed on Nov. 8, 2013 in the Korean Intellectual Property Office, the disclosures of all these applications are incorporated herein by reference.

BACKGROUND OF THE INVENTION

1. Field of the Invention

Embodiments of the invention relate to solar cells, and more particularly to solar cells having an improved electrode structure.

2. Description of the Related Art

Recently, as existing energy resources such as petroleum and coal are running out, interest in alternative energy sources is increasing. In particular, solar cells, which directly convert solar energy into electric energy, are receiving much attention as a next-generation alternative energy source.

These solar cells can be manufactured by forming various layers and electrodes according to a design. In this regard, efficiency of a solar cell can be determined according to the design of various layers and electrodes. For widespread use of the solar cells, low efficiency thereof needs to be overcome. Therefore, there is a need to develop a method of manufacturing a solar cell having maximized efficiency through the design of various layers and electrodes.

SUMMARY OF THE INVENTION

Embodiments of the invention provide solar cells having enhanced efficiency.

In one embodiment of the invention, a solar cell includes a photoelectric conversion unit including a first conductive type region and a second conductive type region formed on the same side of the photoelectric conversion unit. An electrode contacts the photoelectric conversion unit and includes an adhesive layer formed on the photoelectric conversion unit and an electrode layer formed on the adhesive layer. The adhesive layer has a coefficient of thermal expansion that is greater than a coefficient of thermal expansion of the photoelectric conversion unit and is less than a coefficient of thermal expansion of the electrode layer.

The coefficient of thermal expansion of the adhesive layer is greater than coefficients of thermal expansion of both the first conductive type region and the second conductive type region.

The adhesive layer can have transparency.
The adhesive layer can include a metal.
The adhesive layer can include titanium (Ti) or tungsten (W).
The electrode layer can include a plurality of layers, and the adhesive layer has a smaller thickness than each of the plurality of layers of the electrode layer.
The adhesive layer can have a thickness of 50 nm or less.
The photoelectric conversion unit can include at least one of a semiconductor substrate and a semiconductor layer, and semiconductor substrate or the semiconductor layer can include silicon (Si), and the portion of the electrode layer adjacent to the adhesive layer can include at least one of copper (Cu), aluminum (Al), silver (Ag), gold (Au), and alloys thereof.

The electrode layer can include a first electrode layer disposed on the adhesive layer and including a reflective material and a second electrode layer formed on the first electrode layer and connected to a ribbon.

The first electrode layer can include at least one of Cu, Al, Ag, Au, and alloys thereof.

A thickness ratio of the adhesive layer to the first electrode layer can be 1:2 to 1:60.

The thickness ratio of the adhesive layer to the first electrode layer can be 1:10 to 1:30.

The first electrode layer can have a thickness of 50 nm to 300 nm.

The second electrode layer can include at least one of tin (Sn) and a nickel (Ni)-vanadium (V) alloy.

The second electrode layer can be formed by sputtering and have a thickness of 50 nm to 300 nm.

The second electrode layer can be formed by plating and have a thickness of 5 μm to 10 μm.

The electrode layer can further include a third electrode layer formed on the first electrode layer and disposed between the first and second electrode layers, the third electrode having a greater thickness than the first and second electrode layers, and the third electrode having a wider area than the first and second electrode layers.

The third electrode layer can be formed by plating and include Cu.

The electrode layer can further include a seed electrode layer disposed between the first electrode layer and the third electrode layer.

The seed electrode layer can be formed by sputtering and include Cu.

In another embodiment of the invention, a solar cell includes a photoelectric conversion unit including a first conductive type region and a second conductive type region form on the same side of the photoelectric conversion unit; and an electrode formed on the photoelectric conversion unit and including an adhesive layer formed on the photoelectric conversion unit and an electrode layer formed on the adhesive layer, in which the adhesive layer includes titanium (Ti) or tungsten (W).

In the solar cells according to the embodiments of the invention, the electrode includes the adhesive layer having conductivity and transparency and a coefficient of thermal expansion within a certain range and thus the solar cells can have excellent characteristics. That is, since the adhesive layer has conductivity and transparency, the adhesive layer can enable the electrode to maintain excellent conductivity and induce reflection from the portion (e.g., a first electrode layer) of the electrode layer adjacent to the adhesive layer. Accordingly, the first electrode layer acts as a reflective electrode layer and thus increases reflection of light with a long wavelength, which results in increase in the amount of light used in photoelectric conversion. In addition, since the adhesive layer has a coefficient of thermal expansion between coefficients of thermal expansion of the semiconductor substrate (or the semiconductor layer) and the electrode layer, a difference between the coefficients of thermal expansion of the semiconductor substrate (or the semiconductor layer) and the electrode layer is reduced and, accordingly, contact characteristics between the semiconductor substrate (or the semiconductor layer) and the electrode layer can be enhanced. As such, efficiency of the solar cell can be enhanced by improving various characteristics thereof.

BRIEF DESCRIPTION OF THE DRAWINGS

Details of the embodiments of the invention will be more clearly understood from the following detailed description taken in conjunction with the accompanying drawings, in which.

DETAILED DESCRIPTION OF EMBODIMENTS

Figure 1:
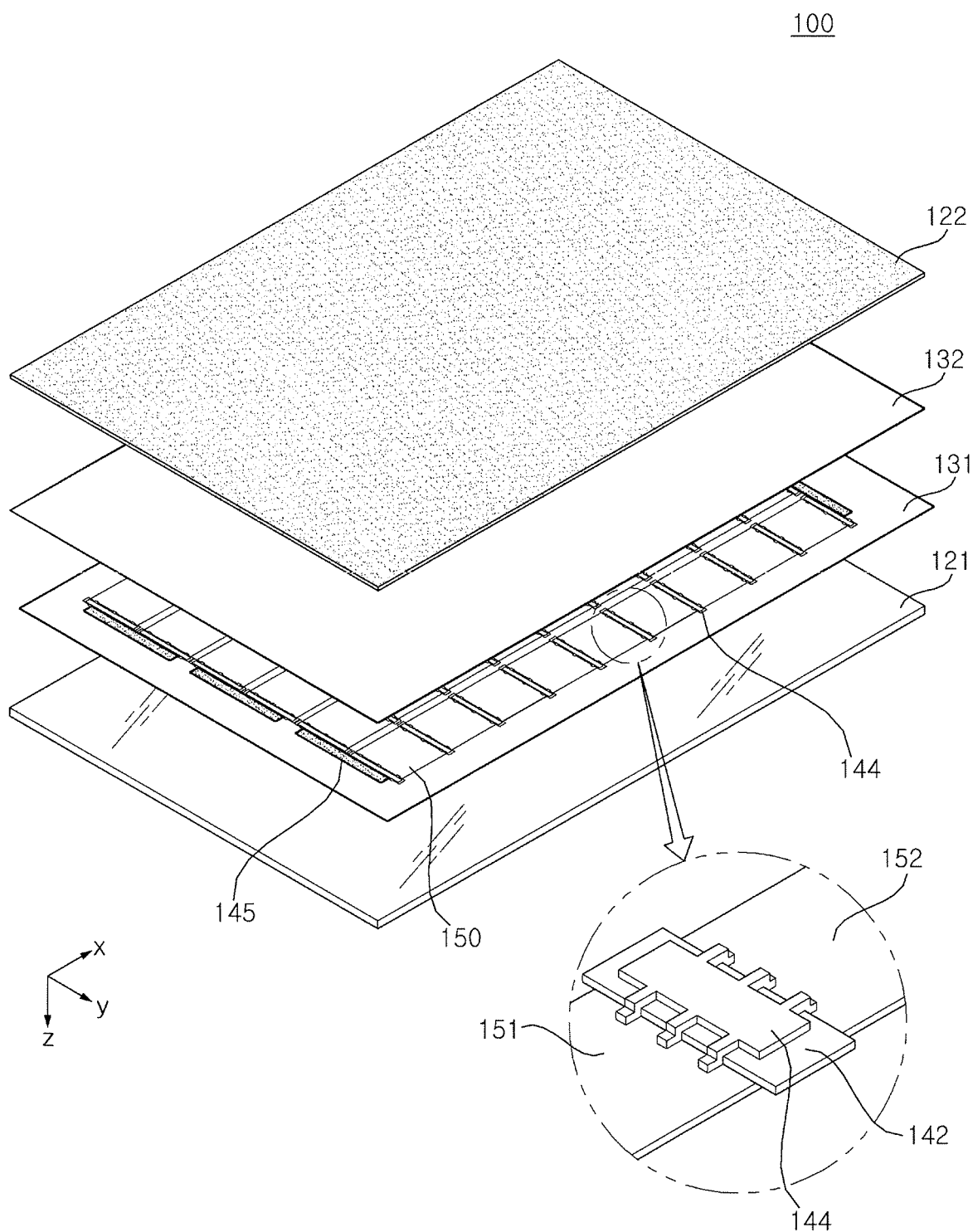
FIG. 1 is a rear perspective view of a solar cell module according to an embodiment of the invention.

Reference will now be made in detail to embodiments of the invention, examples of which are illustrated in the accompanying drawings. However, the invention may be embodied in many different forms and should not be construed as limited to the embodiments set forth herein.

Features of the invention are illustrated in the accompanying drawings and some elements that will not be described herein are omitted from the drawings, for clarity of description. Like reference numerals refer to like elements throughout. In the drawings, the thicknesses, areas, etc., of constituent elements may be exaggerated or reduced for clarity and convenience of illustration. The invention is not limited to the illustrated thicknesses, areas, etc.

It will be further understood that, throughout this specification, when one element is referred to as "comprising" another element, the term "comprising" specifies the presence of another element but does not preclude the presence of other additional elements, unless context clearly indicates otherwise. In addition, when one element, such as a layer, a film, a region or a plate is referred to as being "on" another element, the one element may be directly on the another element, and one or more intervening elements may also be present. In contrast, when one element, such as a layer, a film, a region or a plate is referred to as being "directly on" another element, one or more intervening elements are not present.

Hereinafter, solar cells according to embodiments of the invention and electrodes used in the solar cells will be described in detail with reference to the accompanying drawings. First, a solar cell module will be described in detail and thereafter solar cells included therein and electrodes used in the solar cells will be described in detail.

FIG. 1 is a rear perspective view of a solar cell module 100 according to an embodiment of the invention.

Referring to FIG. 1, the solar cell module 100 according to the embodiment of the invention includes solar cells 150, a first substrate 121 (hereinafter referred to as "front substrate") disposed on front surfaces of the solar cells 150, and a second substrate 122 (hereinafter referred to as "back sheet") disposed on back surfaces of the solar cells 150. In addition, the solar cell module 100 can include a first sealant 131 disposed between the solar cells 150 and the front substrate 121 and a second sealant 132 disposed between the solar cells 150 and the back sheet 122. This will be described below in more detail.

First, each solar cell 150 is configured to include a photoelectric conversion unit to convert solar energy into electric energy and an electrode electrically connected to the photoelectric conversion unit. In the embodiment of the invention, the photoelectric conversion unit can, for example, be a photoelectric conversion unit including a semiconductor substrate (e.g., a silicon wafer) or a semiconductor layer (e.g., a silicon layer). The solar cells 150 having the structure described above will be described below in detail with reference to FIGS. 2 and 3.

The solar cells 150 include ribbons 144 and can be electrically connected to each other by the ribbons 144 in series, in parallel, or in series-parallel. Adjacent first and second solar cells 151 and 152 will be described by way of example. That is, the ribbon 144 can connect a first electrode 42 (see FIGS. 2 and 3) of the first solar cell 151 to a second electrode 44 (see FIGS. 2 and 3) of the second solar cell 152 adjacent to the first solar cell 151. A connection structure among the ribbon 144, the first electrode 42 of the first solar cell 151, and the second electrode 44 of the second solar cell 152 can be variously changed. For example, the first electrodes 42 of the first and second solar cells 151 and 152 can be connected to each other along a first edge, and the second electrodes 44 of the first and second solar cells 151 and 152 can be connected to each other along a second edge opposite the first edge. In this regard, the ribbon 144 can be formed across the first and second solar cells 151 and 152 to connect the first electrode 42 disposed at the first edge of the first solar cell 151 and the second electrode 44 disposed at the second edge of the second solar cell 152 adjacent to the first solar cell 151 and can extend along the first and second edges. In this regard, to prevent unnecessary short circuit between the ribbon 144 and the first and second solar cells 151 and 152, an insulating film 142 is partially disposed between the ribbon 144 and the first and second solar cells 151 and 152, and a protrusion of the ribbon 144 protruding beyond the insulating film 142 can be connected to the first or second electrode 42 or 44. However, the embodiments of the invention are not limited to the above examples and various modifications are possible.

In addition, a bus ribbon 145 alternately connects opposite ends of the ribbons 144 of the solar cells 150 connected by the ribbons 144 and arranged in a single row. The bus ribbon 145 can be arranged in a direction crossing end portions of the solar cells 150 arranged in a single row. The bus ribbon 145 is connected to a junction box that collects electricity generated by the solar cells 150 and prevents reverse flow of electricity.

The first sealant 131 can be disposed on light receiving surfaces of the solar cells 150, and the second sealant 132 can be disposed on the other surfaces of the solar cells 150. The first sealant 131 and the second sealant 132 are adhered to each other by lamination and thus prevent permeation of moisture or oxygen that may adversely affect the solar cells 150 and enable chemical bonding of the elements of the solar cells 150.

The first sealant 131 and the second sealant 132 can be ethylene vinyl acetate (EVA) copolymer resin, polyvinyl butyral, a silicon resin, an ester-based resin, an olefin-based resin, or the like, but the embodiment of the invention is not limited thereto. Thus, the first and second sealants 131 and 132 can be formed using various other materials by various methods other than lamination.

The front substrate 121 is disposed on the first sealant 131 to pass sunlight therethrough and can be made of tempered glass to protect the solar cells 150 from external impact and the like. In addition, the front substrate 121 can be made of low-iron tempered glass to prevent reflection of sunlight and increase transmittance of sunlight, but the embodiment of the invention is not limited thereto. That is, the front substrate 121 can be made of various other materials.

The back sheet 122 is disposed on the other surfaces of the solar cells 150 to protect the solar cells and is waterproof and insulating and blocks ultraviolet light. The back sheet 122 can be made of a film, a sheet, or the like. The back sheet 122 can be of a Tedlar/PET/Tedlar (TPT) type or can be a structure in which polyvinylidene fluoride (PVDF) resin or the like is formed on at least one surface of polyethylene terephthalate (PET). PVDF, which is a polymer having a structure of $(CH_2CF_2)_n$, has a double fluorine molecular structure and thus has excellent mechanical properties, weather resistance and UV resistance, but the embodiment of the invention is not limited thereto. That is, the back sheet 122 can be made of various other materials. In this regard, the back sheet 122 can be made of a material with excellent reflectance to reflect sunlight incident from the front substrate 121 and for the sunlight to be reused, but the embodiment of the invention is not limited thereto. That is, the back sheet 122 can be made of a transparent material (e.g., glass) so that sunlight is incident thereupon and thus the solar cell module 100 can be embodied as a double-sided light receiving solar cell module.

The structure of the above-described solar cell 150 will now be described in detail with reference to FIGS. 2 and 3.

Figure 2:
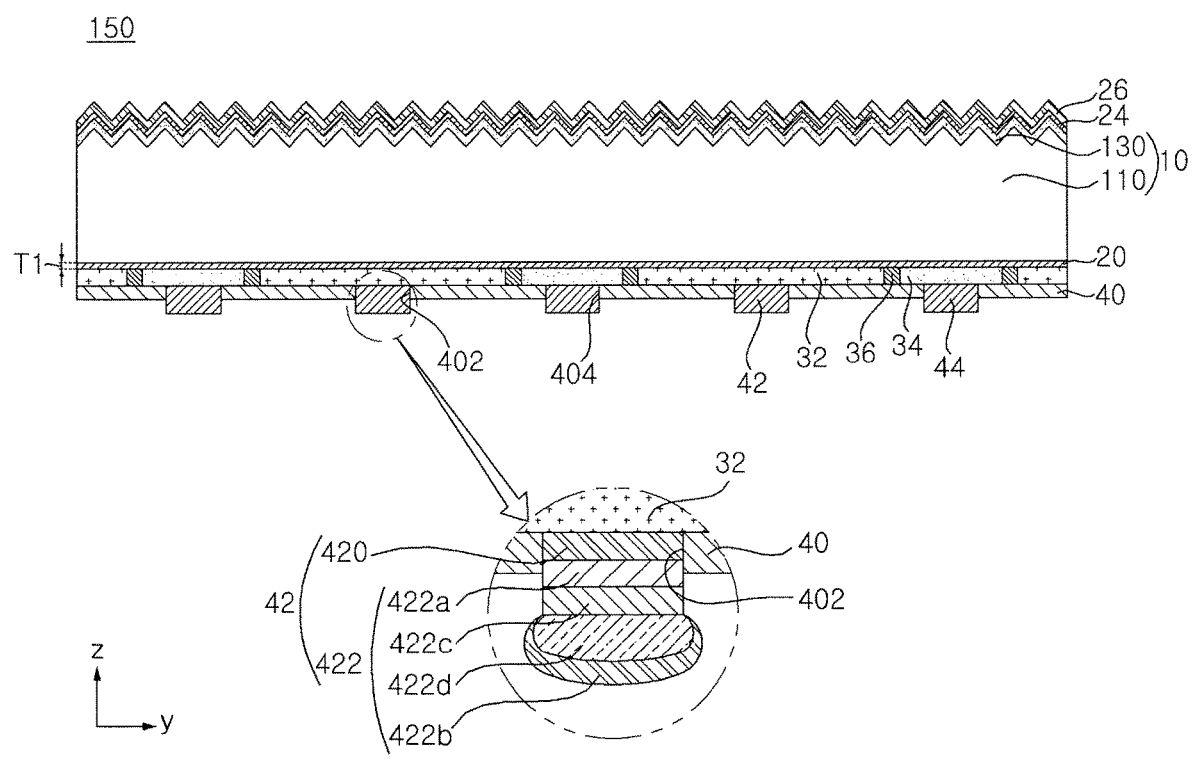
FIG. 2 is a sectional view of a solar cell according to the embodiment of the invention.

FIG. 2 is a sectional view of the solar cell 150 according to the embodiment of the invention. FIG. 3 is a partial rear plan view of the solar cell 150 of FIG. 2.

Figure 3:
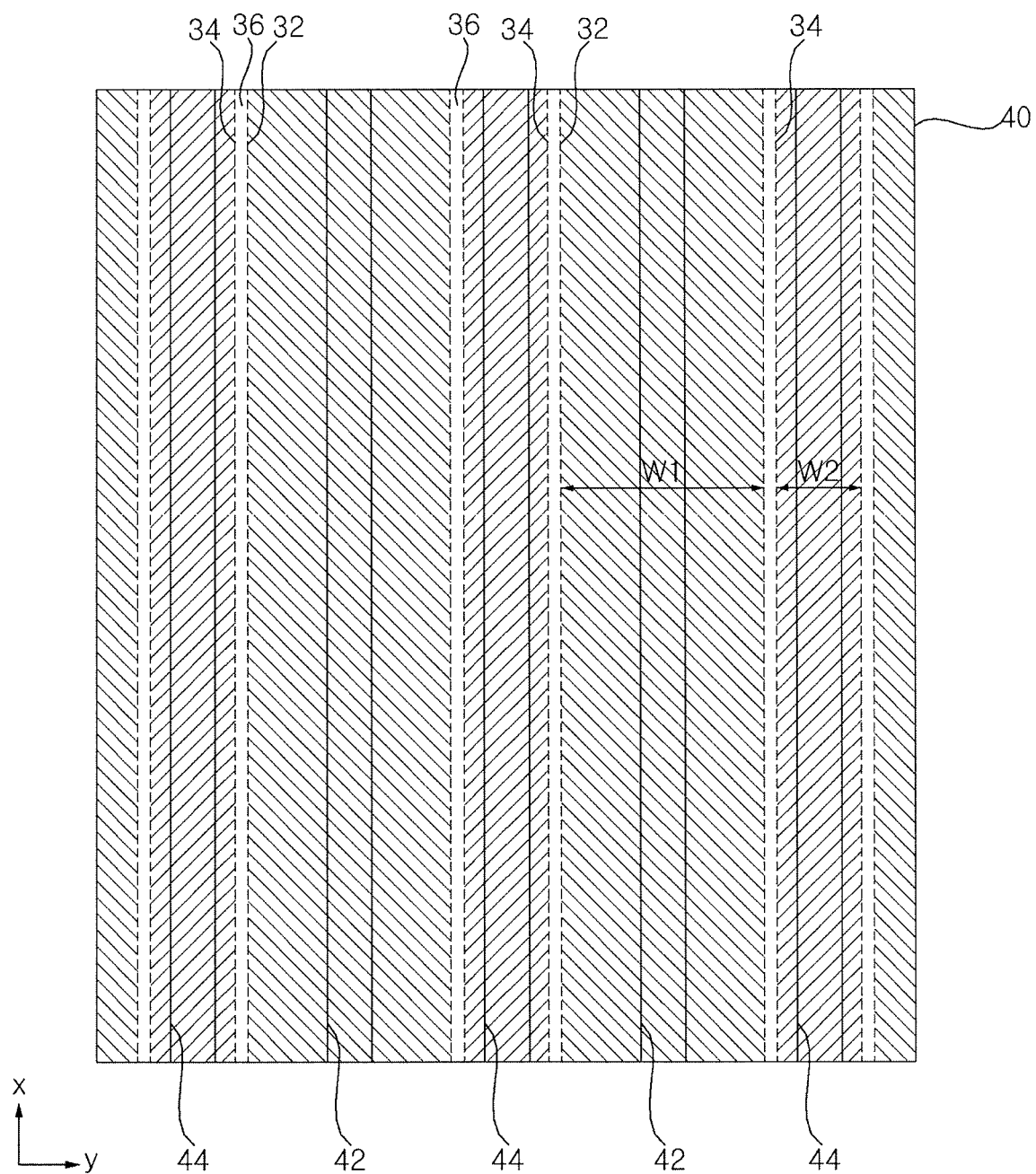
FIG. 3 is a partial rear plan view of the solar cell illustrated in FIG. 2.

Referring to FIGS. 2 and 3, the solar cell 150 according to the embodiment of the invention includes a semiconductor substrate 10 including a base region 110, a tunneling layer 20 disposed on a surface (e.g., a back surface) of the semiconductor substrate 10, conductive type regions 32 and 34 disposed on the tunneling layer 20, and electrodes 42 and 44 respectively connected to the conductive type regions 32 and 34. In addition, the solar cell 150 can further include a passivation film 24, an anti-reflective film 26, and an insulating layer 40 (or a back surface passivation film). This will be described below in more detail.

The semiconductor substrate 10 can include the base region 110 including a second conductive type dopant at a relatively low doping concentration. In the embodiment of the invention, the base region 110 can include crystalline (mono-crystalline or polycrystalline) silicon including a second conductive type dopant. For example, the base region 110 can be a mono-crystalline silicon substrate (e.g., a mono-crystalline silicon wafer) including a second conductive type dopant. The second conductive type dopant can be of an n-type or a p-type. The n-type dopant can be a Group V element, such as phosphorus (P), arsenic (As), bismuth (Bi), antimony (Sb), or the like, and the p-type dopant can be a Group III element, such as boron (B), aluminum (Al), gallium (Ga), indium (In), or the like. For example, when the base region 110 is of an n-type, a first conductive type region 32 of a p-type to form a junction (e.g., a pn junction with the tunneling layer 20 disposed therebetween) that forms carriers by photoelectric conversion with the base region 110 has a wide area and thus a photoelectric conversion area can be increased. In addition, in this instance, the first conductive type region 32 having a wide area effectively collects holes having a relatively slow movement rate and thus can further contribute to improvement in photoelectric conversion efficiency. However, the embodiment of the invention is not limited to the above examples.

In addition, the semiconductor substrate 10 can include a front surface field region 130 at a front surface thereof. The front surface field region 130 can have the same conductive type as that of the base region 110 and a higher doping concentration than the base region 110.

In the embodiment of the invention, the front surface field region 130 is a doping region formed by doping the semiconductor substrate 10 with a second conductive type dopant at a relatively high doping concentration. Accordingly, the front surface field region 130 constitutes the semiconductor substrate 10, including a crystalline (mono-crystalline or polycrystalline) semiconductor of a second conductive type. For example, the front surface field region 130 can be formed as a portion of a mono-crystalline semiconductor substrate (e.g., a mono-crystalline silicon wafer substrate) of a second conductive type. However, the embodiment of the invention is not limited to the above examples. Thus, the front surface field region 130 can be formed by doping a separate semiconductor layer from the semiconductor substrate 10 (e.g., an amorphous semiconductor layer, a microcrystalline semiconductor layer, or a polycrystalline semiconductor layer) with a second conductive type dopant. In another embodiment of the invention, the front surface field region 130 can be a field region that acts similarly to a region formed through doping by fixed charges of a layer formed adjacent to the semiconductor substrate 10 (e.g., the passivation film 24 and/or the anti-reflective film 26). The front surface field region 130 having various structures can be formed using various other methods.

In the embodiment of the invention, the front surface of the semiconductor substrate 10 can be textured to have an uneven portion in the form of a pyramid, or the like. Through the texturing process, the uneven portion is formed at the front surface of the semiconductor substrate 10 and thus surface roughness thereof increases, whereby reflectance of light incident upon the front surface of the semiconductor substrate 10 can be reduced. Accordingly, the amount of light reaching a pn junction formed by the base region 110 and the first conductive type region 32 can be increased and, consequently, light loss can be minimized.

Meanwhile, the back surface of the semiconductor substrate 10 can be a relatively smooth and even surface formed by mirror polishing or the like and having a lower surface roughness than the front surface of the semiconductor substrate 10. As in the embodiment of the invention, when the first and second conductive type regions 32 and 34 are formed together on the back surface of the semiconductor substrate 10, characteristics of the solar cells 150 can largely vary according to characteristics of the back surface of the semiconductor substrate 10. Since an uneven portion by texturing is not formed at the back surface of the semiconductor substrate 10, passivation characteristics can be enhanced and, accordingly, the characteristics of the solar cells 150 can be enhanced. However, the embodiment of the invention is not limited to the above example. In some instances, an uneven portion can be formed at the back surface of the semiconductor substrate 10 by texturing. In addition, various modifications are possible.

The tunneling layer 20 is formed on the back surface of the semiconductor substrate 10. Interface properties of the back surface of the semiconductor substrate 10 can be enhanced by the tunneling layer 20 and the tunneling layer 20 enables carriers generated by photoelectric conversion to be smoothly transferred by tunneling effects. The tunneling layer 20 can include various materials enabling carriers to tunnel therethrough, e.g., an oxide, a nitride, a semiconductor, a conductive polymer, or the like. For example, the tunneling layer 20 can include silicon oxide, silicon nitride, silicon oxynitride, intrinsic amorphous silicon, intrinsic polycrystalline silicon, or the like. In this regard, the tunneling layer 20 can be formed over the entire back surface of the semiconductor substrate 10. Accordingly, the tunneling layer 20 can completely passivate the back surface of the semiconductor substrate 10 and be easily formed without separate patterning.

To have sufficient tunneling effects, the tunneling layer 20 can have a thickness T1 that is smaller than that of the insulating film 40. For example, the thickness T1 of the tunneling layer 20 can be 10 nm or less, for example, 0.5 nm to 10 nm (more particularly, 0.5 nm to 5 nm, e.g., 1 nm to 4 nm). When the thickness T1 of the tunneling layer 20 exceeds 10 nm, tunneling does not smoothly occur and thus the solar cells 150 may not operate. Further, when the thickness T1 of the tunneling layer 20 is less than 0.5 nm, it can be difficult to form the tunneling layer 20 with desired quality. To further improve the tunneling effects, the thickness T1 of the tunneling layer 20 can be 0.5 nm to 5 nm (more particularly, 1 nm to 4 nm). However, the embodiment of the invention is not limited to the above examples and the thickness T1 of the tunneling layer 20 can have various values.

The conductive type regions 32 and 34 can be disposed on the tunneling layer 20. More particularly, the conductive type regions 32 and 34 can include the first conductive type region 32 including a first conductive type dopant thus having a first conductive type and the second conductive type region 34 including a second conductive type dopant thus having a second conductive type. In addition, a barrier region 36 can be disposed between the first and second conductive type regions 32 and 34.

The first conductive type region 32 forms a pn junction (or pn tunnel junction) with the base region 110 and the tunneling layer 20 disposed therebetween and thus constitutes an emitter region that generates carriers by photoelectric conversion.

In this regard, the first conductive type region 32 can include a semiconductor (e.g., silicon) including a first conductive type dopant opposite the base region 110. In the embodiment of the invention, the first conductive type region 32 is formed separately from the semiconductor substrate 10, on the semiconductor substrate 10 (more particularly, on the tunneling layer 20) and is formed as a semiconductor layer doped with a first conductive type dopant. Thus, the first conductive type region 32 can be formed as a semiconductor layer having a different crystal structure than the semiconductor substrate 10 to be easily formed on the semiconductor substrate 10. For example, the first conductive type region 32 can be formed by doping an amorphous semiconductor, micro-crystalline semiconductor or polycrystalline semiconductor (e.g., amorphous silicon, micro-crystalline silicon, or polycrystalline silicon) that can be easily manufactured by various methods, such as deposition and the like, with a first conductive type dopant. The first conductive type dopant can be included in the semiconductor layer when forming the semiconductor layer or can be included in the semiconductor layer by various doping methods, such as thermal diffusion, ion implantation, and the like after forming the semiconductor layer.

In this regard, the first conductive type dopant can be any dopant having a conductive type opposite the base region 110. That is, when the first conductive type dopant is of a p-type, the first conductive type dopant can be a Group III element, such as B, Al, Ga, In, or the like. When the first conductive type dopant is of an n-type, the first conductive type dopant can be a Group V element, such as P, As, Bi, Sb, or the like.

The second conductive type region 34 forms a back surface field and thus forms a back surface field region that prevents loss of carriers by recombination at a surface (more particularly, the back surface) of the semiconductor substrate 10.

In this regard, the second conductive type region 34 can include a semiconductor (e.g., silicon) including the same second conductive type dopant as that of the base region 110. In the embodiment of the invention, the second conductive type region 34 is formed separately from the semiconductor substrate 10, on the semiconductor substrate 10 (more particularly, on the tunneling layer 20) and is formed as a semiconductor layer doped with a second conductive type dopant. Thus, the second conductive type region 34 can be formed as a semiconductor layer having a different crystal structure than the semiconductor substrate 10 to be easily formed on the semiconductor substrate 10. For example, the second conductive type region 34 can be formed by doping an amorphous semiconductor, micro-crystalline semiconductor or polycrystalline semiconductor (e.g., amorphous silicon, micro-crystalline silicon, or polycrystalline silicon) that may be easily manufactured by various methods, such as deposition and the like, with a second conductive type dopant. The second conductive type dopant can be included in the semiconductor layer when forming the semiconductor layer or can be included in the semiconductor layer by various doping methods, such as thermal diffusion, ion implantation, and the like after forming the semiconductor layer.

In this regard, the second conductive type dopant can be any dopant having the same conductive type as that of the base region 110. That is, when the second conductive type dopant is of an n-type, the second conductive type dopant can be a Group V element, such as P, As, Bi, Sb, or the like. When the second conductive type dopant is of a p-type, the second conductive type dopant can be a Group III element, such as B, Al, Ga, In, or the like.

In addition, the barrier region 36 is disposed between the first and second conductive type regions 32 and 34 to separate the first conductive type region 32 from the second conductive type region 34. When the first and second conductive type regions 32 and 34 contact each other, shunting occurs and, accordingly, performance of the solar cells 150 may be deteriorated. Thus, in the embodiment of the invention, the barrier region 36 can be disposed between the first and second conductive type regions 32 and 34 to prevent unnecessary occurrence of shunting.

The barrier region 36 can include various materials enabling the first and second conductive type regions 32 and 34 to be substantially insulated from each other. That is, the barrier region 36 can be formed of an undoped insulating material (e.g., an oxide or a nitride). In another embodiment of the invention, the barrier region 36 can include an intrinsic semiconductor. In this regard, the first and second conductive type regions 32 and 34 and the barrier region 36 are formed on the same plane, have substantially the same thickness, are formed of the same semiconductor (e.g., amorphous silicon, micro-crystalline silicon, or polycrystalline silicon), and may not include a dopant. For example, a semiconductor layer including a semiconductor material can be formed, a region of the semiconductor layer is doped with a first conductive type dopant to form the first conductive type region 32, another region thereof is doped with a second conductive type dopant to form the second conductive type region 34, and the barrier region 36 can be formed in a region of the semiconductor layer in which the first and second conductive type regions 32 and 34 are not formed. According to the embodiment of the invention, a manufacturing method of the first and second conductive type regions 32 and 34 and the barrier region 36 may be simplified.

However, the embodiment of the invention is not limited to the above examples. That is, when the barrier region 36 is formed separately from the first and second conductive type regions 32 and 34, the barrier region 36 can have a different thickness than that of the first and second conductive type regions 32 and 34. For example, to more effectively prevent short circuit between the first and second conductive type regions 32 and 34, the thickness of the barrier region 36 can be greater than that of the first and second conductive type regions 32 and 34. In another embodiment of the invention, to reduce raw material costs for forming the barrier region 36, the thickness of the barrier region 36 can be less than that of the first and second conductive type regions 32 and 34. In addition, various modifications are possible. In addition, a basic constituent material of the barrier region 36 can be different than those of the first and second conductive type regions 32 and 34. In another embodiment of the invention, the barrier region 36 can be formed as an empty space (e.g., a trench) disposed between the first and second conductive type regions 32 and 34.

In addition, the barrier region 36 can be formed to separate only portions of the first and second conductive type regions 32 and 34 at an interface therebetween from each other. Thus, other portions of the first and second conductive type regions 32 and 34 at the interface therebetween may contact each other. In addition, the barrier region 36 may not be necessarily formed, and the first and second conductive type regions 32 and 34 can entirely contact each other. In addition, various modifications are possible.

In this regard, the second conductive type region 34 having the same conductive type as that of the base region 110 can have a narrower area than that of the first conductive type region 32 having a different conductive type than that of the base region 110. Thus, a pn junction formed between the base region 110 and the first conductive type region 32 via the tunneling layer 20 can have a wider area. In this regard, when the base region 110 and the second conductive type region 34 are n-type conductive and the first conductive type region 32 is p-type conductive, the first conductive type region 32 having a wide area can effectively collect holes having a relatively slow movement rate. The planar structure of the first and second conductive type regions 32 and 34 and the barrier region 36 will be described below in further detail with reference to FIG. 3.

In the embodiment of the invention, an instance in which the first and second conductive type regions 32 and 34 are disposed on the back surface of the semiconductor substrate 10 with the tunneling layer 20 disposed therebetween has been described by way of example. However, the embodiment of the invention is not limited to the above example. In another embodiment of the invention, the tunneling layer 20 need not be formed and the first and second conductive type regions 32 and 34 can be formed as doping regions formed by doping the semiconductor substrate 10 with a dopant. That is, the first and second conductive type regions 32 and 34 can be formed as doping regions having a mono-crystalline semiconductor structure constituting a portion of the semiconductor substrate 10. This structure will be described below in more detail with reference to FIG. 8. The first and second conductive type regions 32 and 34 can be formed using various other methods.

The insulating layer 40 can be formed on the first and second conductive type regions 32 and 34 and the barrier region 36. The insulating layer 40 can prevent electrodes to which the first and second conductive type regions 32 and 34 must not be connected (i.e., the second electrode 44 for the first conductive type region 32 and the first electrode 42 for the second conductive type region 34) from being connected to each other and can passivate the first and second conductive type regions 32 and 34. The insulating layer 40 includes first openings 402 to expose the first conductive type regions 32 and second openings 404 to expose the second conductive type regions 34.

The insulating layer 40 can have the same or greater thickness than that of the tunneling layer 20. Accordingly, insulation and passivation characteristics can be enhanced. The insulating layer 40 can be formed of various insulating materials (e.g., an oxide, a nitride, or the like). For example, the insulating layer 40 can be any one film selected from the group consisting of a silicon nitride film, a hydrogen-containing silicon nitride film, a silicon oxide film, a silicon oxynitride film, an $Al_2O_3$ film, a $MgF_2$ film, a ZnS film, a $TiO_2$ film, and a $CeO_2$ film or have a multilayer structure including two or more of the above-listed films in combination. However, the embodiment of the invention is not limited to the above examples, and the insulating layer 40 can include various other materials.

The electrodes 42 and 44 disposed on the back surface of the semiconductor substrate 10 include the first electrode 42 electrically and physically connected to the first conductive type region 32 and the second electrode 44 electrically and physically connected to the second conductive type region 34.

In this regard, the first electrode 42 is connected to the first conductive type region 32 via the first opening 402 of the insulating layer 40, and the second electrode 44 is connected to the second conductive type region 34 via the second opening 404 of the insulating layer 40. The first and second electrodes 42 and 44 can include various metal materials. In addition, the first and second electrodes 42 and 44 are not electrically connected to each other but are respectively connected to the first conductive type region 32 and the second conductive type region 34, and can have various planar shapes enabling collection of carriers generated and transfer of the collected carriers to the outside. However, the shapes of the first and second electrodes 42 and 44 are not limited to the above example.

Hereinafter, a stacked structure of the first electrode 42 and/or the second electrode 44 will be described in detail with reference to an enlarged circle of FIG. 2, and the planar structure of the first electrode 42 and/or the second electrode 44 will be described in detail with reference to FIG. 3. The first electrode 42 will be described below with reference to the enlarged circle of FIG. 2 by way of example, but the second electrode 44 can also have the same or similar structure as that of the first electrode 42. That is, the stacked structure of the first electrode 42 can also be applied to the second electrode 44.

Referring to the enlarged circle of FIG. 2, the first electrode 42 contacts the first conductive type region 32 formed as a semiconductor layer (hereinafter referred to as a semiconductor layer) (a semiconductor layer constituting the second conductive type region 34 in the instance of the second electrode 44) and can include an adhesive layer 420 that is transparent and conductive and an electrode layer 422 formed on the adhesive layer 420. In this regard, the electrode layer 422 basically acts as an electrode that collects carriers generated by photoelectric conversion and transfers the collected carriers to the outside, and the adhesive layer 420 can enhance adhesion between the first conductive type region 32 and the electrode layer 422.

The adhesive layer 420 can be formed between the semiconductor layer and the electrode layer 422 in contact therewith. The adhesive layer 420 has conductivity and can include a metal having excellent contact characteristics with the semiconductor layer. Accordingly, conductivity of the first electrode 42 need not be reduced and adhesion between the semiconductor layer and the electrode layer 422 can be enhanced. To enhance contact characteristics with the semiconductor layer, the adhesive layer 420 can have a coefficient of thermal expansion between a coefficient of thermal expansion of the semiconductor layer and a coefficient of thermal expansion of a portion of the electrode layer 422 adjacent to the adhesive layer 420.

More particularly, when a difference between the coefficients of thermal expansion of the semiconductor layer and the first electrode 42 is large, interfacial contact between the semiconductor layer and the first electrode 42 may be deteriorated when various heat treatment processes for forming the solar cells 150 are performed. Accordingly, a contact resistance between the semiconductor layer and the first electrode 42 can be increased. This reduces a line width of the semiconductor layer or the first electrode 42 and thus may be more problematic when a contact area between the semiconductor layer and the first electrode 42 decreases. Thus, in the embodiment of the invention, a coefficient of thermal expansion between the semiconductor layer and the first electrode 42 is reduced by restricting a coefficient of thermal expansion of the adhesive layer 420 of the first electrode 42 contacting the semiconductor layer, which results in enhanced interfacial contact characteristics.

The semiconductor layer has a coefficient of thermal expansion of about 4.2 ppm/K when including silicon, and copper (Cu), aluminum (Al), silver (Ag), gold (Au), or the like that can constitute the portion of the electrode layer 422 adjacent to the adhesive layer 420 (e.g., in the embodiment of the invention, a first electrode layer 422a) has a coefficient of thermal expansion of approximately 14.2 ppm/K or more. More particularly, Cu has a coefficient of thermal expansion of about 16.5 ppm/K, Al has a coefficient of thermal expansion of about 23.0 ppm/K, Ag has a coefficient of thermal expansion of about 19.2 ppm/K, and Au has a coefficient of thermal expansion of about 14.2 ppm/K.

Considering this, a material (e.g., a metal) constituting the adhesive layer 420 can have a coefficient of thermal expansion of about 4.5 ppm/K to about 14 ppm/K. When the coefficient of thermal expansion of the material is less than 4.5 ppm/K or exceeds 14 ppm/K, a difference between the coefficients of thermal expansion of the adhesive layer 420 and the semiconductor layer is reduced and thus adhesion enhancement effects may be insufficient. Considering this, the adhesive layer 420 can include titanium (Ti) having a coefficient of thermal expansion of about 8.4 ppm/K or tungsten (W) having a coefficient of thermal expansion of about 4.6 ppm/K. For example, the adhesive layer 420 can be formed of Ti or W.

As such, when the adhesive layer 420 includes Ti or W, contact characteristics can be enhanced by reducing a difference between the coefficients of thermal expansion of the adhesive layer 420 and the semiconductor layer. In addition, Ti or W can act as a barrier of a material (e.g., Cu or the like) constituting the portion (e.g., in the embodiment of the invention, the first electrode layer 422a) of the electrode layer 422 adjacent to the adhesive layer 420 and thus can prevent the material from diffusing into the semiconductor layer or the semiconductor substrate 10. Accordingly, problems that may occur through diffusion of the material constituting the electrode layer 422 into the semiconductor layer or the semiconductor substrate 10 can be prevented or reduced.

In this regard, the adhesive layer 420 according to the embodiment of the invention can have transparency, which allows light to pass therethrough. When the adhesive layer 420 has a small thickness even when including a metal, the adhesive layer 420 can have transparency. Thus, in the embodiment of the invention, the adhesive layer 420 can have light transmitting properties by restricting the thickness of the adhesive layer 420 to a certain level or less. When the adhesive layer 420 has transparency, light having passed through the adhesive layer 420 is directed back into the semiconductor substrate 10 by reflection from the electrode layer 422 formed on the adhesive layer 420 or a layer constituting a portion of the electrode layer 422 (e.g., the first electrode layer 422a). Due to reflection of light from the first electrode 42, the amount and residence time of light present in the semiconductor substrate 10 is increased and, accordingly, efficiency of the solar cells 150 can be enhanced.

The term "transparency" as used herein includes an instance in which light is completely (i.e., 100%) transmitted and an instance in which light is partially transmitted. That is, the adhesive layer 420 can be a metal transparent film or a metal semi-transparent film. For example, the adhesive layer 420 can have a transparency of 50% to 100%, more particularly 80% to 100%. When the transparency of the adhesive layer 420 is less than 50%, the amount of light reflected from the electrode layer 422 is insufficient and thus it may be difficult to sufficiently enhance the efficiency of the solar cell 150. When the transparency of the adhesive layer 420 is 80% or more, the amount of light reflected from the electrode layer 422 can be further increased and thus can further contribute to improvement in the efficiency of the solar cells 150.

For this operation, the adhesive layer 420 can have a smaller thickness than the electrode layer 422. As in the embodiment of the invention, when the electrode layer 422 includes a plurality of layers (e.g., the first electrode layer 422a, a second electrode layer 422b, a third electrode layer 422d, and a seed electrode layer 422c), the adhesive layer 420 can have a smaller thickness than each of the layers. Thus, the adhesive layer 420 can be formed to have transparency.

In particular, the adhesive layer 420 can have a thickness of 50 nm or less. When the thickness of the adhesive layer 420 exceeds 50 nm, the transparency of the adhesive layer 420 is reduced and thus the amount of light directed to the electrode layer 422 may be insufficient. The transparency of the adhesive layer 420 can be further enhanced by forming the adhesive layer 420 to a thickness of 15 nm or less. In this regard, the thickness of the adhesive layer 420 can be between 5 nm and 50 nm (e.g., between 5 nm and 15 nm). When the thickness of the adhesive layer 420 is less than 5 nm, it may be difficult to uniformly form the adhesive layer 420 on the semiconductor layer and adhesion enhancement effects obtained by the adhesive layer 420 may be insufficient. However, the embodiment of the invention is not limited to the above examples and the thickness and the like of the adhesive layer 420 can vary in consideration of materials, manufacturing conditions, and the like.

The electrode layer 422 formed on the adhesive layer 420 can include a plurality of layers to enhance various characteristics and the like. In the embodiment of the invention, the electrode layer 422 includes the first electrode layer 422a formed on the adhesive layer 420 and including a reflective material and the second electrode layer 422b formed on the first electrode layer 422a and connected to (e.g., contacting) the ribbon 144. In addition, the electrode layer 422 can further include the seed electrode layer 422c and the third electrode layer 422d that are formed between the first electrode layer 422a and the second electrode layer 422b. Hereinafter, the layers constituting the electrode layer 422 will be described according to the stacking sequence.

The first electrode layer 422a formed on the adhesive layer 420 can contact the adhesive layer 420. The first electrode layer 422a acts as a barrier that prevents a material constituting the electrode layer 422 from migrating to the semiconductor layer or the semiconductor substrate 10 and reflects light by a reflective material. That is, the first electrode layer 422a can act as both a barrier layer and a reflective electrode layer. The first electrode layer 422a can be formed of a metal having excellent reflection properties and can include, for example, Cu, Al, Ag, Au, or an alloy thereof. When the seed electrode layer 422c including Cu or the like or formed of Cu is disposed on the first electrode layer 422a, the first electrode layer 422a can include Al, Ag, Au, or an alloy thereof or be formed of Al, Ag, Au, or an alloy thereof.

The first electrode layer 422a has a greater thickness than the adhesive layer 420 and can have a thickness of 50 nm to 300 nm. For example, the first electrode layer 422a can have a thickness of 100 nm to 300 nm. When the thickness of the first electrode layer 422a is less than 50 nm, it may be difficult for the first electrode layer 422a to act as a barrier layer and a reflective electrode layer. When the thickness of the first electrode layer 422a exceeds 300 nm, reflection properties and the like are not significantly enhanced and manufacturing costs may be increased. When the thickness of the first electrode layer 422a is between 100 nm and 300 nm, function of the first electrode layer 422a as a barrier layer and a reflective electrode layer can be further enhanced.

In addition, a thickness ratio of the adhesive layer 420 to the first electrode layer 422a can be 1:2 to 1:60. More particularly, the thickness ratio of the adhesive layer 420 to the first electrode layer 422a can be 1:10 to 1:30. When the thickness ratio is less than 1:2, the thickness of the adhesive layer 420 increases and thus transparency thereof may be reduced or the thickness of the first electrode layer 422a decreases and thus reflection properties and the like may be deteriorated. Further, when the thickness ratio exceeds 1:60, the thickness of the first electrode layer 422a increases and thus manufacturing costs may be increased. When the thickness ratio is 1:10 to 1:30, characteristics of both the adhesive layer 420 and the first electrode layer 422a can be enhanced. However, the embodiment of the invention is not limited to the above examples, and the thickness ratio, and the like can be variously changed.

The seed electrode layer 422c disposed on the first electrode layer 422a acts as a seed of the third electrode layer 422d (the second electrode layer 422b when the third electrode layer 422d is not formed) formed on the seed electrode layer 422c and enables the third electrode layer 422d to be easily formed. That is, the seed electrode layer 422c is disposed between the first electrode layer 422a and the third electrode layer 422d and can be in contact therewith.

The third electrode layer 422d can be formed by plating or the like, and the seed electrode layer 422c is formed between the first electrode layer 422a and the third electrode layer 422d so that the third electrode layer 422d is satisfactorily formed by plating. When the third electrode layer 422d includes Cu, the seed electrode layer 422c can include Cu or be formed of Cu. The third electrode layer 422d formed to include Cu by plating uses the seed electrode layer 422c as a seed and thus can be easily formed and have excellent characteristics.

The seed electrode layer 422c can have a thickness of 50 nm to 200 nm. When the thickness of the seed electrode layer 422c is less than 50 nm, effects obtained by the seed electrode layer 422c may be insufficient. Further, when the thickness of the seed electrode layer 422c exceeds 200 nm, manufacturing costs and the like may be increased. However, the embodiment of the invention is not limited to the above examples and the thickness and the like of the seed electrode layer 422c can be variously changed.

The adhesive layer 420, the first electrode layer 422a, and the seed electrode layer 422c can be formed by sputtering or the like. That is, the adhesive layer 420, the first electrode layer 422a, and the seed electrode layer 422c of the first electrode 42 (and/or the second electrode 44) can be formed by entirely forming metal layers respectively constituting the adhesive layer 420, the first electrode layer 422a, and the seed electrode layer 422c to fill the openings 402 (the openings 404 in the instance of the second electrode 44) of the insulating layer 40 formed on the first and second conductive type regions 32 and 34 formed as semiconductor layers and the barrier region 36 and patterning the metal layers. The patterning process can be performed using various methods, e.g., a method using a resist and an etchant.

The adhesive layer 420, the first electrode layer 422a, and the seed electrode layer 422c, formed by sputtering, are mostly stacked in a thickness direction and thus have a uniform thickness. In addition, the metal layers respectively corresponding to the adhesive layer 420, the first electrode layer 422a, and the seed electrode layer 422c are sequentially and entirely formed and then patterned together using the same resist (or mask). Thus, side cross-sections of at least parts of at least two of the adhesive layer 420, the first electrode layer 422a, and the seed electrode layer 422c can be continuously formed. In addition, the at least parts of the at least two of the adhesive layer 420, the first electrode layer 422a, and the seed electrode layer 422c can have area error within 10% (e.g., within 5%). It can be confirmed that the adhesive layer 420, the first electrode layer 422a, and the seed electrode layer 422c are formed by sputtering and patterned together according to thicknesses, shapes, an area difference, and the like. However, the embodiment of the invention is not limited to the above examples, and the adhesive layer 420, the first electrode layer 422a, and the seed electrode layer 422c can be formed using various methods.

The third electrode layer 422d can be formed on the seed electrode layer 422c in contact therewith. The third electrode layer 422d serves to reduce resistance of the electrode layer 422 and increase electrical conductivity thereof and thus can act as a conductive layer to substantially transfer current. The third electrode layer 422d can include a metal (e.g., Cu) that is inexpensive and highly conductive. However, the embodiment of the invention is not limited to the above example, and various known metals can be used to form the third electrode layer 422d.

The third electrode layer 422d can have a greater thickness than the adhesive layer 420, the first electrode layer 422a, the seed electrode layer 422c, and the second electrode layer 422b. For example, the third electrode layer 422d can have a thickness of 20 µm to 30 µm. When the thickness of the third electrode layer 422d is less than 20 µm, it may be difficult to sufficiently reduce resistance. Further, when the thickness of the third electrode layer 422d exceeds 30 µm, manufacturing time may be increased and, accordingly, manufacturing costs may be increased.

The third electrode layer 422d can be formed by plating using the seed electrode layer 422c as a seed. As such, when the third electrode layer 422d is formed by plating, the third electrode layer 422d having a sufficient thickness can be formed within a short time. The third electrode layer 422d formed by plating grows both in a thickness direction and in a side direction and thus is convexly formed to have a wider area than the adhesive layer 420, the first electrode layer 422a, and the seed electrode layer 422c and, consequently, can have a rounded surface. However, the embodiment of the invention is not limited to the above examples and a formation method, shape and the like of the third electrode layer 422d can be variously changed.

Figure 4:
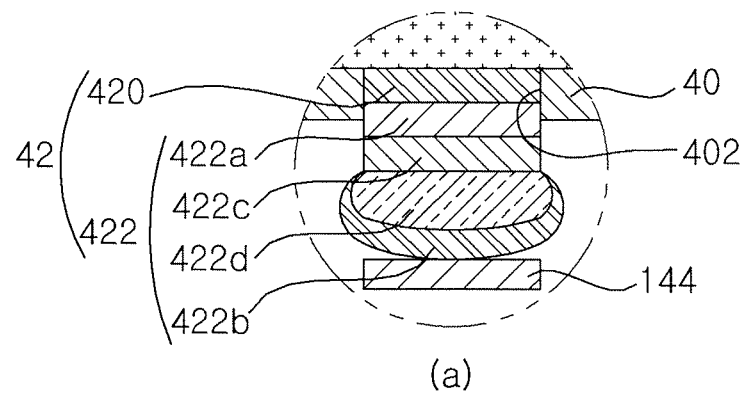
FIG. 4 illustrates schematic enlarged views illustrating various examples of an adhesion structure between an electrode and a ribbon of a solar cell according to an embodiment of the invention.
Figure 4:
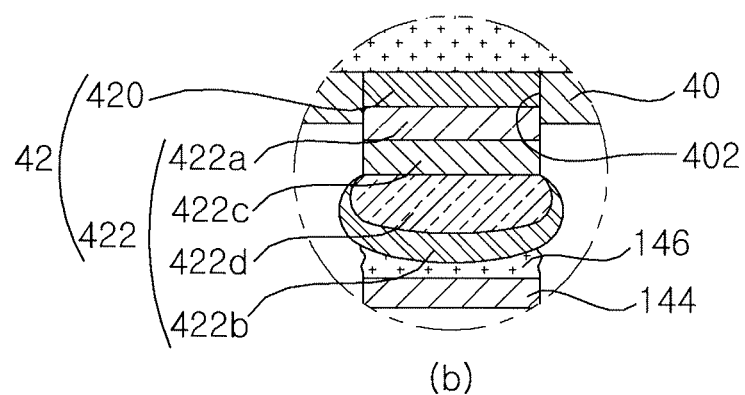
Figure 4:
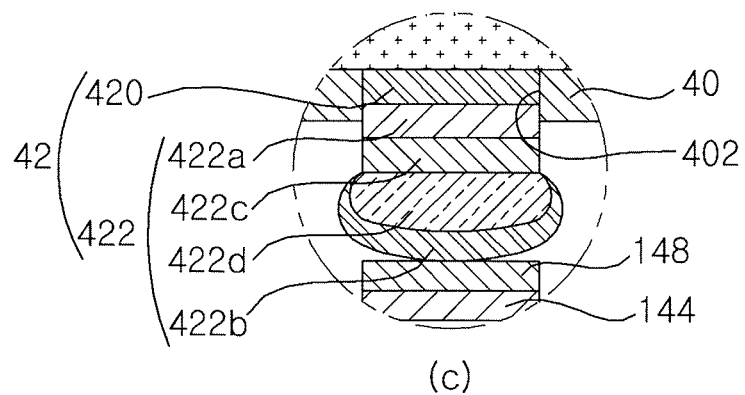

The second electrode layer 422b can be formed on the third electrode layer 422d. For example, the second electrode layer 422b can contact the third electrode layer 422d thereon. The second electrode layer 422b is a portion connected to the ribbon 144 and can include a material having excellent connection properties with the ribbon 144. Various examples of a connection structure between the second electrode layer 422b and the ribbon 144 will be described with reference to FIG. 4. FIG. 4 illustrates enlarged views illustrating various examples of an adhesion structure between the first electrode 42 of the solar cell 150 and the ribbon 144. For clear and brief explanation, a shape of the first electrode 42 of FIG. 4 is illustrated based on the shape of the first electrode 42 illustrated in an enlarged circle of FIG. 2.

In an embodiment of the invention, as illustrated in (a) of FIG. 4, the ribbon 144 can be directly attached to the second electrode layer 422b by disposing the ribbon 144 including, for example, lead (Pb) and tin (Sn) on the second electrode layer 422b and applying heat thereto. In another embodiment of the invention, as illustrated in (b) of FIG. 4, the second electrode layer 422b can be attached to the ribbon 144 via a paste layer 146 by applying heat in a state in which a paste (e.g., a paste including Sn, Bi, and the like) is disposed between the second electrode layer 422b and the ribbon 144. In another embodiment of the invention, as illustrated in (c) of FIG. 4, the second electrode layer 422b can be attached to the ribbon 144 via a conductive film 148 by applying pressure in a state in which the conductive film 148 is disposed between the second electrode layer 422b and the ribbon 144. The conductive film 148 can be prepared by dispersing conductive particles formed of Au, Ag, nickel (Ni), Cu, or the like, which are highly conductive, in a film formed of epoxy resin, acryl resin, polyimide resin, polycarbonate resin, or the like. When such a conductive film is pressed while applying heat, conductive particles are exposed to outside of the film and the solar cells 150 and the ribbon 144 can be electrically connected by the exposed conductive particles. As such, when a solar cell module is manufactured by connecting plural solar cells 150 by a conductive film, manufacturing temperature can be reduced and thus bending of the solar cells 150 can be prevented or reduced. The second electrode layer 422b and the ribbon 144 can be attached and connected to each other by various other methods.

The second electrode layer 422b can include Sn or a Ni-Vanadium (V) alloy. Sn has excellent adhesion with the ribbon 144, a paste for connection with the ribbon 144, or the like. In addition, the Ni—V alloy has excellent adhesion with the ribbon 144 or a paste for connection with the ribbon 144. More particularly, in a paste including Sn and Bi, Sn of the paste has very high adhesion with Ni of the Ni—V alloy. In addition, a Ni—V alloy has a very high melting point of about 1000° C. or more and thus has a higher melting point than materials of the other layers constituting the electrode layer 422. Thus, the second electrode layer 422b is not deformed during adhesion to the ribbon 144 or manufacturing of the solar cells 150 and can sufficiently act as a capping film to protect the other layers constituting the electrode layer 422.

The second electrode layer 422b can be formed using various methods. In the embodiment of the invention, the second electrode layer 422b is formed by plating and includes Sn. The second electrode layer 422b can have a thickness of 5 µm to 10 µm and can be formed to cover the first electrode layer 422a and have a convexly rounded shape. When the thickness of the second electrode layer 422b is less than 5 µm, it may be difficult to uniformly form the second electrode layer 422b. Further, when the thickness of the second electrode layer 422b exceeds 10 µm, manufacturing costs may be increased. However, the embodiment of the invention is not limited to the above examples. An instance in which the second electrode layer 422b is formed by sputtering and includes Sn or a Ni—V alloy will be described below in detail with reference to FIG. 6.

Hereafter, planar shapes of the first and second conductive type regions 32 and 34, the barrier region 36, and the first and second electrodes 42 and 44 will be described in detail with reference to FIG. 3.

Referring to FIG. 3, in the embodiment of the invention, the first and second conductive type regions 32 and 34 are formed long to have a stripe shape and alternately disposed with respect to each other in a direction crossing a longitudinal direction. The barrier region 36 can be disposed to separate the first conductive type region 32 from the second conductive type region 34. Plural first conductive type regions 32 separated from each other can be connected to each other at an edge of a first side thereof, and plural second conductive type regions 34 separated from each other can be connected to each other at an edge of a second side thereof. However, the embodiment of the invention is not limited to the above examples.

In this regard, the first conductive type region 32 can have a wider area than the second conductive type region 34. For example, the areas of the first and second conductive type regions 32 and 34 can be adjusted by differently adjusting widths thereof. That is, a width W1 of the first conductive type region 32 can be greater than a width W2 of the second conductive type region 34. Thus, the area of the first conductive type regions 32 constituting an emitter region is sufficiently formed, which enables photoelectric conversion to occur in a wide region. In this regard, when the first conductive type regions 32 are of a p-type, the area of the first conductive type regions 32 is sufficiently secured and thus holes having a relatively slow movement rate can be effectively collected.

In addition, the first electrode 42 can be formed to have a stripe shape to correspond to the first conductive type region 32, and the second electrode 44 can be formed to have a stripe shape to correspond to the second conductive type region 34. The first and second openings 402 and 404 can be formed to respectively correspond to total areas of the first and second electrodes 42 and 44. Thus, a contact area between the first electrode 42 and the first conductive type region 32 and a contact area between the second electrode 44 and the second conductive type region 34 are maximized and, accordingly, carrier collection efficiency can be enhanced. However, the embodiment of the invention is not limited to the above examples. In addition, the first and second openings 402 and 404 can also be formed to respectively connect only portions of the first and second electrodes 42 and 44 to the first and second conductive type regions 32 and 34. For example, the first and second openings 402 and 404 can be formed as a plurality of contact holes. The first electrodes 42 can be connected to each other at an edge of a first side thereof, and the second electrodes 44 can be connected to each other at an edge of a second side thereof. However, the embodiment of the invention is not limited to the above examples.

Referring back to FIG. 2, the passivation film 24 and/or the anti-reflective film 26 can be disposed on the front surface of the semiconductor substrate 10 (more particularly, the front surface field region 130 formed at the front surface of the semiconductor substrate 10). According to embodiments of the invention, only the passivation film 24 can be formed on the semiconductor substrate 10, only the anti-reflective film 26 can be formed on the semiconductor substrate 10, or the passivation film 24 and the anti-reflective film 26 can be sequentially disposed on the semiconductor substrate 10. FIG. 2 illustrates an instance in which the passivation film 24 and the anti-reflective film 26 are sequentially formed on the semiconductor substrate 10 and the semiconductor substrate 10 contacts the passivation film 24. However, the embodiment of the invention is not limited to the above examples, and the semiconductor substrate 10 can contact the anti-reflective film 26. In addition, various modifications are possible.

The passivation film 24 and the anti-reflective film 26 can be substantially entirely formed on the front surface of the semiconductor substrate 10. In this regard, the expression "entirely formed" as used herein includes an instance in which the passivation film 24 and the anti-reflective film 26 are physically completely formed and an instance in which the passivation film 24 and the anti-reflective film 26 are incompletely formed.

The passivation film 24 is formed on the front surface of the semiconductor substrate 10 in contact therewith and thus inactivates defects present in the front surface or bulk of the semiconductor substrate 10. Thus, recombination sites of minority carriers are removed and, accordingly, an open circuit voltage of the solar cell 150 can be increased. The anti-reflective film 26 reduces reflectance of light incident upon the front surface of the semiconductor substrate 10. Thus, the amount of light reaching a pn junction formed at an interface between the base region 110 and the first conductive type region 32 can be increased by reducing the reflectance of light incident upon the front surface of the semiconductor substrate 10. Accordingly, a short-circuit current Isc of the solar cell 150 can be increased. As such, the open circuit voltage and the short-circuit current Isc of the solar cell 150 can be increased by the passivation film 24 and the anti-reflective film 26 and, accordingly, the efficiency of the solar cell 150 can be enhanced.

The passivation film 24 and/or the anti-reflective film 26 can be formed of various materials. For example, the passivation film 24 can be any one film selected from the group consisting of a silicon nitride film, a hydrogen-containing silicon nitride film, a silicon oxide film, a silicon oxynitride film, an aluminum oxide film, a $MgF_2$ film, a ZnS film, a $TiO_2$ film, and a $CeO_2$ film or have a multilayer structure including two or more of the above-listed films in combination. For example, the passivation film 24 can include silicon oxide, and the anti-reflective film 26 can include silicon nitride.

When light is incident upon the solar cell 150 according to the embodiment of the invention, electrons and holes are generated by photoelectric conversion at the pn junction formed between the base region 110 and the first conductive type region 32, and the generated holes and electrons tunnel through the tunneling layer 20, respectively move to the first and second conductive type regions 32 and 34 and then respectively migrate to the first and second electrodes 42 and 44. Electric energy is generated thereby.

As in the embodiment of the invention, in the solar cell 150 having a back contact structure in which the first and second electrodes 42 and 44 are formed on the back surface of the semiconductor substrate 10 and not formed on the front surface of the semiconductor substrate 10, shading loss at the front surface of the semiconductor substrate 10 can be minimized. Accordingly, efficiency of the solar cell 150 can be enhanced. However, the embodiment of the invention is not limited to the above examples. The structures of the first and second electrodes 42 and 44 according to the embodiment of the invention can be applied to the solar cell 150 having an electrode structure in which the first electrode 42 is disposed on the front surface of the semiconductor substrate 10 (in particular, the second electrode 44 disposed on the back surface of the solar cell 150).

In the solar cell 150 having the above-described structure, the first and second electrodes 42 and 44 include the adhesive layer 420 that has conductivity and transparency and has a coefficient of thermal expansion within a certain range and thus can have excellent characteristics. That is, since the adhesive layer 420 has conductivity and transparency, the adhesive layer 420 enables the first and second electrodes 42 and 44 to maintain high conductivity and induces reflection from the electrode layer 422 (e.g., the first electrode layer 422a) adjacent thereto. Accordingly, the first electrode layer 422a acts as a reflective electrode layer and thus reflection of light having a long wavelength is increased, which results in increased amount of light used in photoelectric conversion. In addition, the adhesive layer 420 has a coefficient of thermal expansion between coefficients of thermal expansion of the semiconductor layer and the electrode layer 422 constituting the first or second conductive type region 32 or 34. By reducing a difference between coefficients of thermal expansion of the first or second conductive type region 32 or 34 or the semiconductor layer and the electrode layer 422, contact characteristics between the first or second conductive type region 32 or 34 or the semiconductor layer and the first or second electrode 42 or 44 can be enhanced. As such, the efficiency of the solar cell 150 can be enhanced by enhancing various characteristics of the solar cell 150.

Hereinafter, solar cells according to other embodiments of the invention and electrodes used therein will be described in detail. A detailed description of the same or almost the same elements as those in the foregoing description will be omitted herein and a detailed description of only different elements will be provided herein. The first electrode 42 will be described below with reference to the following drawings by way of example, but the following description can also be applied to the second electrode 44.

Figure 5:
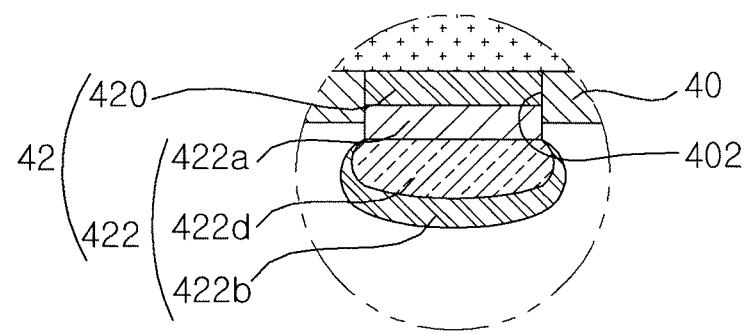
FIG. 5 is a view of an electrode that can be used in a solar cell according to another embodiment of the invention and illustrates a portion corresponding to an enlarged circle of FIG. 1.

FIG. 5 is a view of an electrode that can be used in a solar cell according to another embodiment of the invention. FIG. 5 illustrates a portion corresponding to the enlarged circle of FIG. 1.

Referring to FIG. 5, the first electrode 42 of the solar cell according to the embodiment of the invention does not include the seed electrode layer 422c (see FIG. 2), and the third electrode layer 422d is formed on the first electrode layer 422a in contact therewith. In the embodiment of the invention, the seed electrode layer 422c is not formed and thus manufacturing processes can be simplified and manufacturing costs can be reduced.

Figure 6:
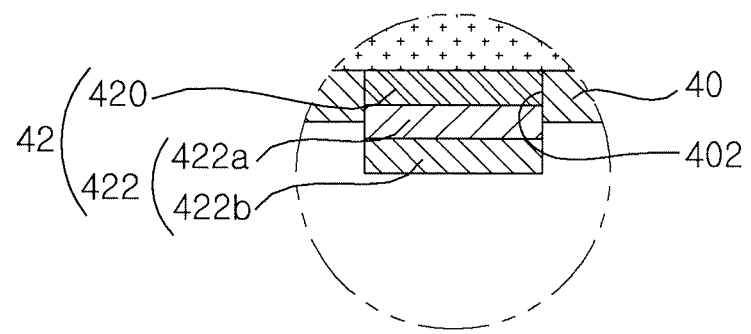
FIG. 6 is a view of an electrode that can be used in a solar cell according to another embodiment of the invention and illustrates a portion corresponding to the enlarged circle of FIG. 1.

FIG. 6 is a view of an electrode that can be used in a solar cell according to another embodiment of the invention. FIG. 6 illustrates a portion corresponding to the enlarged circle of FIG. 1.

Referring to FIG. 6, the first electrode 42 of the solar cell according to the embodiment of the invention does not include the seed electrode layer 422c (see FIG. 2) nor the third electrode layer 422d (see FIG. 2), and the second electrode layer 422b is formed on the first electrode layer 422a in contact therewith. That is, the first electrode 42 can include the adhesive layer 420, the first electrode layer 422a, and the second electrode layer 422b that contact each other. In this regard, the second electrode layer 422b is a sputter layer formed by sputtering and can include Sn or a Ni—V alloy.

As such, the first electrode 42 including the adhesive layer 420, the first electrode layer 422a, and the second electrode layer 422b can be formed by sputtering or the like. That is, the adhesive layer 420, the first electrode layer 422a, and the seed electrode layer 422c of the first electrode 42 (and/or the second electrode 44) can be formed by entirely forming metal layers respectively constituting the adhesive layer 420, the first electrode layer 422a, and the second electrode layer 422b to fill the openings 402 (the openings 404 in the instance of the second electrode 44) of the insulating layer 40 formed on the back surface of the semiconductor substrate 10 and patterning the metal layers. The patterning process can be performed using various methods, e.g., a method using a resist and an etchant.

The adhesive layer 420, the first electrode layer 422a, and the second electrode layer 422b, formed by sputtering, are mostly stacked in a thickness direction and thus have a uniform thickness. In addition, the metal layers respectively corresponding to the adhesive layer 420, the first electrode layer 422a, and the second electrode layer 422b are sequentially and entirely formed and then patterned together using the same resist (or mask). Accordingly, side surfaces of at least parts of at least two of the adhesive layer 420, the first electrode layer 422a, and the second electrode layer 422b can have a continuous shape. In addition, the at least parts of the at least two of the adhesive layer 420, the first electrode layer 422a, and the second electrode layer 422b can have area error within 10% (e.g., within 5%). It can be confirmed that the adhesive layer 420, the first electrode layer 422a, and the second electrode layer 422b are formed by sputtering and patterned together according to thicknesses, shapes, area difference, and the like. However, the embodiment of the invention is not limited to the above examples, and the adhesive layer 420, the first electrode layer 422a, and the second electrode layer 422b can be formed using various methods.

The second electrode layer 422b can have a nano-scale thickness, for example, 50 nm to 300 nm. When the thickness of the second electrode layer 422b is less than 50 nm, adhesion to the ribbon 144 can be reduced. Further, when the thickness of the second electrode layer 422b exceeds 300 nm, manufacturing costs may be increased. The embodiment of the invention is not limited to the above examples and the thickness and the like of the second electrode layer 422b can be variously changed.

As such, in the embodiment of the invention, the first electrode 42 can be formed without performing plating. In an instance in which a portion of the first electrode 42 is formed by plating, when defects, such as pin holes, scratch, or the like are present in the insulating layer 40, plating can be implemented even thereon and thus undesired portions can be plated. In addition, a plating solution used in a plating process is acidic or basic and thus may damage the insulating layer 40 or deteriorate characteristics of the insulating layer 40. In the embodiment of the invention, by not using a plating process, the characteristics of the insulating layer 40 can be enhanced and the first electrode 42 can be formed using simplified manufacturing processes.

Figure 7:
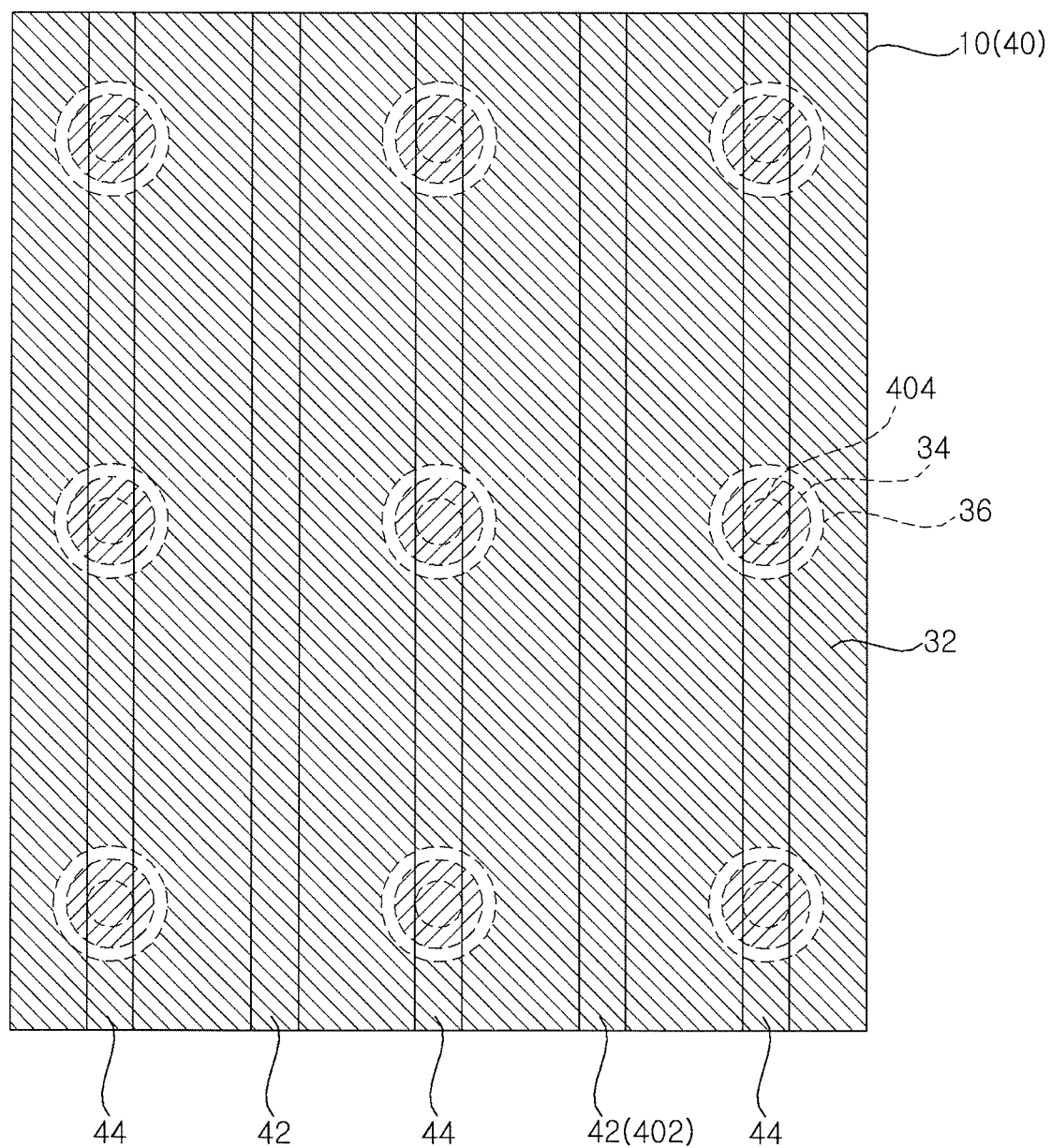
FIG. 7 is a partial rear plan view of a solar cell according to another embodiment of the invention.

FIG. 7 is a partial rear plan view of a solar cell 150 according to another embodiment of the invention.

Referring to FIG. 7, in the solar cell 150 according to the embodiment of the invention, plural second conductive type regions 34 can have an island shape and be spaced apart from each other, and the first conductive type region 32 can be entirely formed in a portion excluding the second conductive type regions 34 and the barrier region 36 surrounding each second conductive type region 34.

Due to such a configuration, the first conductive type region 32 has an area as wide as possible and thus photoelectric conversion efficiency can be enhanced. In addition, the second conductive type regions 34 can be disposed on the semiconductor substrate 10 with a large area while the first conductive type region 32 has a minimized area. Accordingly, surface recombination can be effectively prevented or reduced by the second conductive type regions 34 and the area of the second conductive type regions 34 can be maximized. However, the embodiment of the invention is not limited to the above examples, and the second conductive type regions 34 can have various shapes that enable the second conductive type regions 34 to have a minimized area.

Although FIG. 7 illustrates the second conductive type regions 34 as having a circular shape, the embodiment of the invention is not limited thereto. That is, the second conductive type regions 34 can also have a planar shape, for example, an oval shape or a polygonal shape, such as a triangle, a tetragon, a hexagon, or the like.

The first and second openings 402 and 404 formed in the insulating layer 40 can have different shapes in consideration of shapes of the respective first and second conductive type regions 32 and 34. That is, the first opening 402 can extend long on the first conductive type region 32, and plural second openings 404 can be spaced apart from each other to correspond to the respective second conductive type regions 34. This is considering that the first electrode 42 is disposed only on the first conductive type region 32, and the second electrode 44 is disposed on the first and second conductive type regions 32 and 34. That is, the second openings 404 of the insulating layer 40 are formed to correspond to portions in which the second conductive type regions 34 are disposed, and the second electrode 44 and the second conductive type region 34 are connected by the second opening 404. In addition, the second openings 404 are not formed in portions of the insulating layer corresponding to the first conductive type regions 32 and thus the second electrodes 44 can be insulated from the first conductive type regions 32. The first electrode 42 is formed only on each first conductive type region 32 and thus the first opening 402 can have the same or similar to that of the first electrode 42 and, accordingly, the first electrodes 42 can entirely contact the first conductive type regions 32 thereon. However, the embodiment of the invention is not limited to the above examples and various modifications are possible. For example, the first openings 402 can be formed as a plurality of contact holes having a similar shape to that of the second openings 404.

Figure 8:
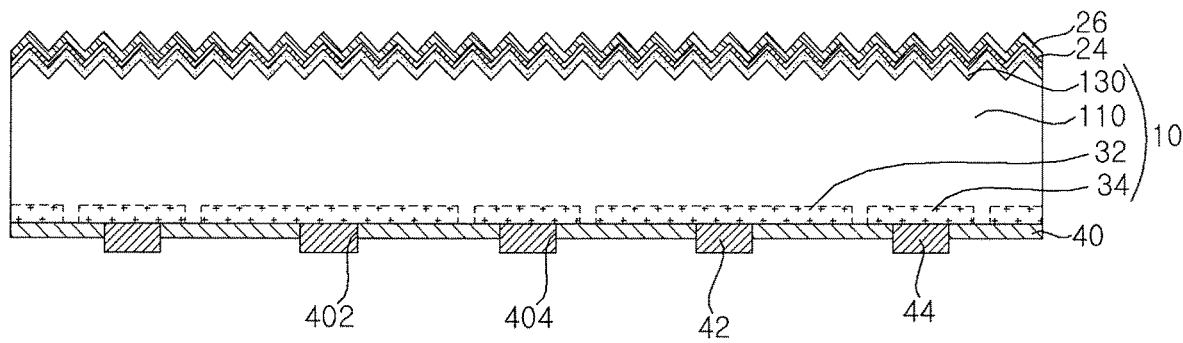
FIG. 8 is a sectional view of a solar cell according to another embodiment of the invention.

FIG. 8 is a sectional view of a solar cell 150 according to another embodiment of the invention.

Referring to FIG. 8, in the solar cell 150 according to the embodiment of the invention, the tunneling layer 20 (see FIG. 2) is not formed, and the first and second conductive type regions 32 and 34 are formed as doping regions formed in the semiconductor substrate 10. That is, each of the first and second conductive type regions 32 and 34 is formed as a doping region formed by doping the semiconductor substrate 10 with a first or second conductive type dopant at a relatively high doping concentration. Accordingly, each of the first and second conductive type regions 32 and 34 constitutes the semiconductor substrate 10 by including a crystalline (mono-crystalline or polycrystalline) semiconductor having a first or second conductive type. For example, each of the first and second conductive type regions 32 and 34 can be formed as a portion of a mono-crystalline semiconductor substrate (e.g., a mono-crystalline silicon wafer substrate) having a first or second conductive type.

In this embodiment of the invention, the adhesive layer 420 (see FIG. 2) of the first electrode 42 contacts the semiconductor substrate 10 (or the first conductive type regions 32 constituting a portion of the semiconductor substrate 10), and an adhesive layer of the second electrode 44 contacts the semiconductor substrate 10 (or the second conductive type regions 34 constituting a portion of the semiconductor substrate 10). The only difference between this embodiment of the invention and the foregoing description is that the adhesive layer 420 of each of the first and second electrodes 42 and 44 contacts the semiconductor substrate 10 instead of contacting the semiconductor layer, and thus, a detailed description thereof will be omitted herein.

One or more embodiments of the invention will now be described more fully with reference to the following examples. However, these examples are provided for illustrative purposes only and are not intended to limit the scope of the invention.

Example 1

A semiconductor substrate including a base region of an n-type was prepared. A first region of a back surface of the semiconductor substrate was doped with boron (B) by ion implantation to form an emitter region, and a second region of the back surface of the semiconductor substrate was doped with phosphorus (P) by ion implantation to form a back surface field region.

An anti-reflective film was formed on a front surface of the semiconductor substrate, and a back surface passivation film was formed on the back surface of the semiconductor substrate. Subsequently, a titanium (Ti) layer (an adhesive layer) having a thickness of 5 nm and a copper (Cu) layer (a first electrode layer) having a thickness of 200 nm were sequentially formed on the back surface passivation film by sputtering and then patterned, thereby forming a first electrode electrically connected to the emitter region and a second electrode electrically connected to the back surface field region. In addition, a process of reducing occurrence of cracks in the back surface passivation film (namely, a curing process) was performed by heat treatment at a temperature of 250° C., thereby completing manufacture of a solar cell.

For reference, in the embodiment of the invention, to measure only characteristics by the adhesive layer and the first electrode layer, a second electrode layer and the like were not formed and only the adhesive layer and the first electrode layer were formed.

Example 2

A solar cell was manufactured in the same manner as in Example 1, except that the thickness of the Ti layer was 10 nm.

Example 3

A solar cell was manufactured in the same manner as in Example 1, except that the thickness of the Ti layer was 30 nm.

Comparative Example 1

A solar cell was manufactured in the same manner as in Example 1, except that the Ti layer was not formed.

Comparative Example 2

A solar cell was manufactured in the same manner as in Example 1, except that the thickness of the Ti layer was 200 nm.

Figure 9:
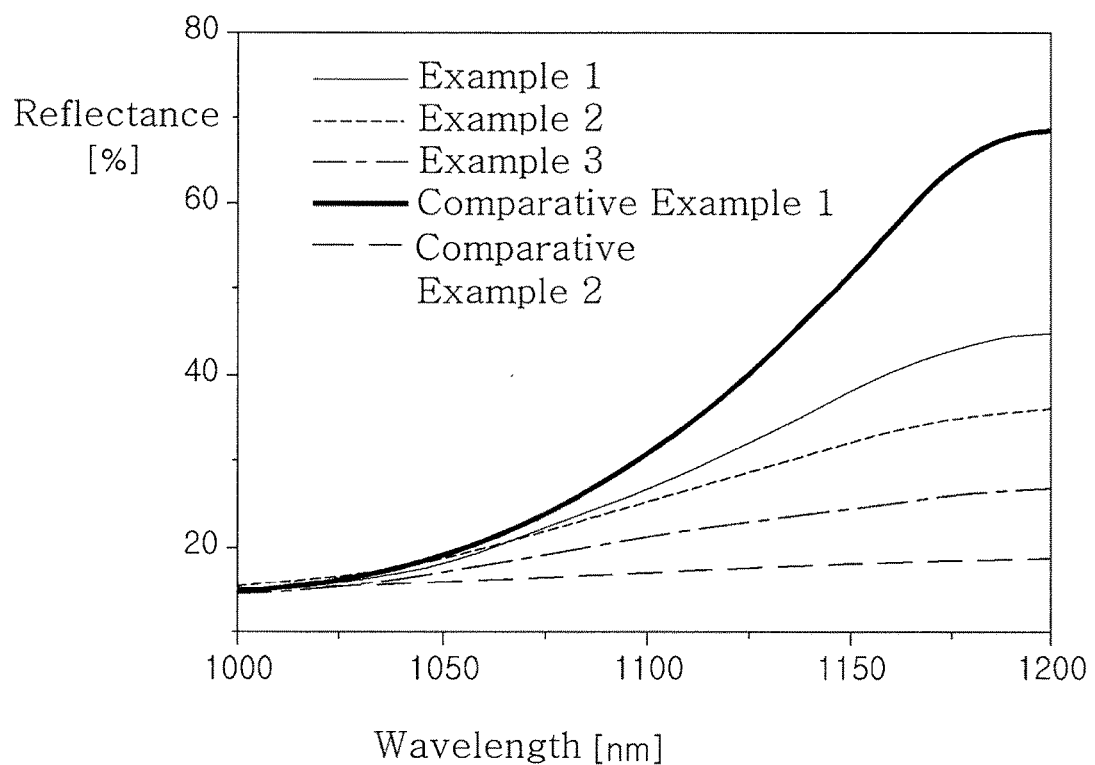
FIG. 9 is a graph showing measurement results of reflectance of an electrode, according to wavelength, for solar cells manufactured according to Examples 1 to 3 and Comparative Examples 1 and 2.

Reflectance according to wavelength of an electrode of each of the solar cells manufactured according to Examples 1 to 3 and Comparative Examples 1 and 2 was measured, and measurement results are illustrated in FIG. 9.

Referring to FIG. 9, it can be confirmed that the reflectance (in particular, reflectance at a long wavelength) of a first electrode is significantly reduced as the thickness of the Ti layer increases. This is considered because transparency of the Ti layer is reduced as the thickness of the Ti layer, which is an adhesive layer, increases and thus reflection of light from the first electrode layer does not satisfactorily occur. In the solar cells of Examples 1 to 3 including the Ti layer having a thickness of 50 nm or less, reflectance of light having a wavelength of 1200 nm is 30% or more. Thus, light with a long wavelength can be reused by reflection. By contrast, in the solar cell of Comparative Example 2 including the Ti layer having a thickness of 200 nm, reflectance of light having a wavelength of 1200 nm has a very small value, i.e., 20% or less, which indicates that it is difficult to reuse light with a long wavelength by reflection.

Figure 10:
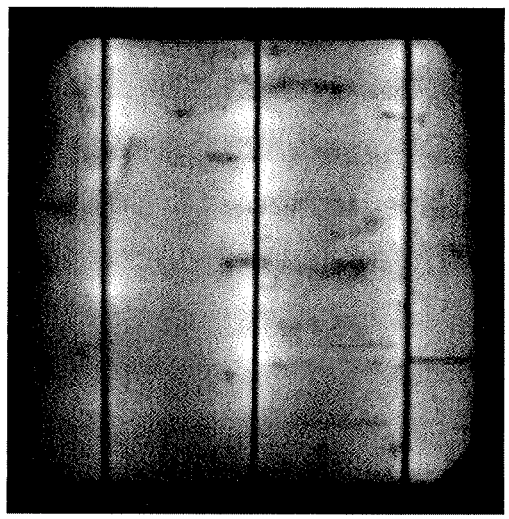
FIG. 10 shows photographs respectively showing a back surface of the solar cell of Example 1 before and after heat treatment to reduce occurrence of cracks in a back surface passivation film, according to an embodiment of the invention.
Figure 10:
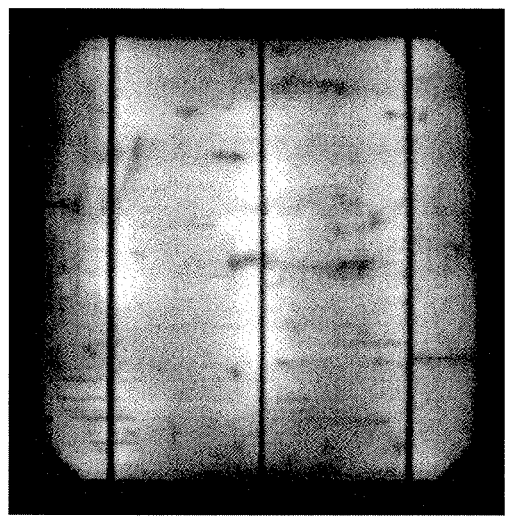
Figure 11:
FIG. 11 shows photographs respectively showing a back surface of the solar cell of Comparative Example 1 before and after heat treatment to reduce occurrence of cracks in a back surface passivation film.
Figure 11:
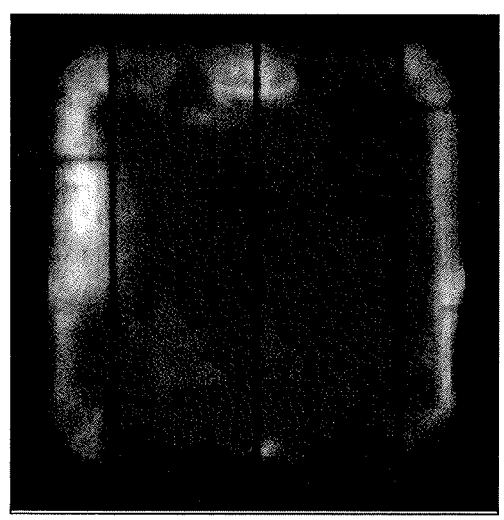

In addition, photographs showing a back surface of the solar cell of Example 1 before and after heat treatment to reduce occurrence of cracks in the back surface passivation film are illustrated in (a) and (b), respectively, of FIG. 10. In addition, photographs showing a back surface of the solar cell of Comparative Example 1 before and after heat treatment to reduce occurrence of cracks in the back surface passivation film are illustrated in (a) and (b), respectively, of FIG. 11. In this regard, the photographs of FIGS. 10 and 11 are taken by detecting light generated when electrons and holes are recombined by applying a bias to the first and second electrodes using a camera. As such, in an instance in which the number of recombination events generated increases by applying a bias to the first and second electrodes, which is contrary to the principle of solar cells, as in solar cells, when light is incident, photoelectric conversion can vigorously occur.

Referring to FIG. 10, it can be confirmed that the photographs showing the back surface of the solar cell of Example 1 before and after heat treatment are generally bright. From the results shown in FIG. 10, it can be confirmed that the first and second electrodes are adhered to the semiconductor substrate while having excellent contact characteristics and the excellent contact characteristics are maintained even in a subsequent heat-treatment process or the like. By contrast, referring to FIG. 11, it can be confirmed that brightness of the photograph showing the back surface of the solar cell of comparative example 1 after heat treatment is further lower than that of the photograph before heat treatment. From the results shown in FIG. 11, it can be confirmed that, in the solar cell of Comparative Example 1 excluding the adhesive layer, contact characteristics between the semiconductor substrate and the first and second electrodes are deteriorated.

Particular characteristics, structures, or effects described in connection with the embodiment of the invention are included in at least one embodiment of the embodiment of the invention and not necessarily in all embodiments of the invention. Furthermore, the particular characteristics, structures, or effects of any specific embodiment of the embodiment of the invention can be combined in any suitable manner with one or more other embodiments of the invention or may be changed by those skilled in the art to which the embodiments of the invention pertain. Therefore, it is to be understood that contents associated with such combination or change fall within the spirit and scope of the embodiment of the invention.

Although embodiments of the invention have been described with reference to a number of illustrative embodiments of the invention, it should be understood that numerous other modifications and applications may be devised by those skilled in the art that will fall within the intrinsic aspects of the embodiments of the invention. More particularly, various variations and modifications are possible in concrete constituent elements of the embodiments. In addition, it is to be understood that differences relevant to the variations and modifications fall within the spirit and scope of the embodiment of the invention defined in the appended claims.

What is claimed is:

1. A solar cell comprising:
a photoelectric conversion unit comprising:
a semiconductor substrate,
a tunneling layer disposed on the semiconductor substrate,
a first conductive type region and a second conductive type region both disposed on the tunneling layer at a same side of the semiconductor substrate, and
a barrier region disposed between the first and second conductive type regions; and
a plurality of electrodes respectively formed on the first conductive type region and the second conductive type region, and each electrode among the plurality of electrodes comprising:
an adhesive layer disposed on the first and second conductive type regions, and
an electrode layer disposed on the adhesive layer,
wherein the adhesive layer has a coefficient of thermal expansion that is greater than a coefficient of thermal expansion of the photoelectric conversion unit and is less than a coefficient of thermal expansion of the electrode layer,
wherein the adhesive layer has transparency and the electrode layer comprises a reflective material, and
wherein the first conductive type region, the second conductive type region, and the barrier region are disposed on a same plane.

2. The solar cell of claim 1, further comprising:
an insulating layer disposed on the first and second conductive type regions and the barrier region.

3. The solar cell of claim 2, wherein the insulating layer includes openings exposing the first conductive type region or the second conductive type region.

4. The solar cell of claim 3, wherein electrodes are connected to the first conductive type region or the second conductive type region via the openings in the insulating layer.

5. The solar cell of claim 1, wherein the coefficient of thermal expansion of the adhesive layer is greater than coefficients of thermal expansion of both the first conductive type region and the second conductive type region.

6. The solar cell according to claim 1, wherein the adhesive layer comprises titanium (Ti) or tungsten (W).

7. The solar cell according to claim 1, wherein the electrode layer comprises a plurality of layers, and the adhesive layer has a smaller thickness than each of the plurality of layers of the electrode layer.

8. The solar cell according to claim 1, wherein the adhesive layer has a thickness of approximately 50 nm or less.

9. The solar cell according to claim 1, wherein the photoelectric conversion unit includes at least one of a semiconductor substrate and a semiconductor layer, and
wherein the semiconductor substrate or the semiconductor layer comprises silicon (Si), and a portion of the electrode layer adjacent to the adhesive layer comprises at least one of copper (Cu), aluminum (Al), silver (Ag), gold (Au), and alloys thereof.

10. The solar cell according to claim 1, wherein the electrode layer comprises:
a first electrode layer disposed on the adhesive layer and comprising a reflective material, and a second electrode layer disposed on the first electrode layer and connected to a ribbon.

11. The solar cell according to claim 10, wherein the first electrode layer comprises at least one of Cu, Al, Ag, Au, and alloys thereof.

12. The solar cell according to claim 10, wherein the second electrode layer comprises at least one of tin (Sn) and a nickel (Ni)-vanadium (V) alloy.

13. The solar cell according to claim 10, wherein the electrode layer further comprises a third electrode layer disposed on the first electrode layer and disposed between the first and second electrode layers.

14. The solar cell according to claim 13, wherein the adhesive layer comprises titanium (Ti),
   wherein the first electrode layer comprises an aluminum (Al),
   wherein the second electrode layer comprises a nickel (Ni)-vanadium (V) alloy, and
   wherein the third electrode layer comprises Cu.

15. The solar cell according to claim 14, wherein the third electrode layer is formed by plating and has a convex shape or a rounded shape, and
   wherein the third electrode layer is wider than the first and second electrode layers.

16. The solar cell according to claim 13, wherein the electrode layer further comprises a seed electrode layer disposed between the first electrode layer and the third electrode layer.

17. The solar cell according to claim 16, wherein the seed electrode layer is formed by sputtering and comprises Cu.

18. A solar cell comprising:
   a photoelectric conversion unit comprising:
      a first conductive type region and a second conductive type region both disposed on a same side of the photoelectric conversion unit; and
      a plurality of electrodes respectively formed on the first conductive type region and the second conductive type region, and each electrode among the plurality of electrodes comprising:
         an adhesive layer disposed on the photoelectric conversion unit, and
         an electrode layer disposed on the adhesive layer,
   wherein the adhesive layer comprises titanium (Ti) or tungsten (W),
   wherein the adhesive layer has transparency and the electrode layer comprises a reflective material, and
   wherein the first conductive type region, the second conductive type region, and the barrier region are disposed on a same plane.

19. A solar cell comprising:
   a photoelectric conversion unit comprising:
      a semiconductor substrate,
      a tunneling layer disposed on the semiconductor substrate,
      a first conductive type region and a second conductive type region both disposed on the tunneling layer at a same side of the semiconductor substrate, and
      a barrier region disposed between the first and second conductive type regions; and
   a plurality of electrodes respectively formed on the first conductive type region and the second conductive type region, and each electrode among the plurality of electrodes comprising:
      an adhesive layer disposed on the first and second conductive type regions, and
      an electrode layer disposed on the adhesive layer,
   wherein the adhesive layer has a coefficient of thermal expansion that is greater than a coefficient of thermal expansion of the photoelectric conversion unit and is less than a coefficient of thermal expansion of the electrode layer, and
   wherein the first conductive type region, the second conductive type region, and the barrier region are disposed on a same plane.

* * * * *